US 6,643,315 B2

(12) United States Patent
Kasukawa et al.

(10) Patent No.: US 6,643,315 B2
(45) Date of Patent: Nov. 4, 2003

(54) DISTRIBUTED FEEDBACK SEMICONDUCTOR LASER DEVICE AND MULTI-WAVELENGTH LASER ARRAY

(75) Inventors: Akihiko Kasukawa, Tokyo (JP); Norihiro Iwai, Tokyo (JP); Masaki Funabashi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 56 days.

(21) Appl. No.: 09/769,395

(22) Filed: Jan. 26, 2001

(65) Prior Publication Data

US 2001/0038659 A1 Nov. 8, 2001

(30) Foreign Application Priority Data

Jan. 28, 2000 (JP) ........................................ 2000-019437

(51) Int. Cl.[7] ................................................. H01S 3/19
(52) U.S. Cl. ............................................. 372/96; 372/45
(58) Field of Search .............................. 372/96, 43, 45, 372/50, 8

(56) References Cited

U.S. PATENT DOCUMENTS

| | | | | |
|---|---|---|---|---|
| 4,468,772 A | * | 8/1984 | Oudar | 372/8 |
| 4,745,616 A | * | 5/1988 | Kaneiwa et al. | 372/96 |
| 5,007,062 A | * | 4/1991 | Chesnoy | 372/26 |
| 5,292,685 A | * | 3/1994 | Inoguchi et al. | 438/32 |
| 5,536,085 A | | 7/1996 | Li et al. | |
| 5,897,329 A | | 4/1999 | Jewell | |
| 6,031,851 A | * | 2/2000 | Shimizu et al. | 372/18 |

FOREIGN PATENT DOCUMENTS

WO    WO 97/50109    12/1997

OTHER PUBLICATIONS

J. Heerlein, et al., IEEE Journal of Selected Topics in Quantum Electronics, vol. 5, No. 3, XP–000930550, pp. 701–706, "Highly Efficient Laterally Oxidized $\lambda$=950 nm InGaAs—AlGaAs Single–Mode Lasers", May/Jun. 1999.
U.S. patent application Ser. No. 09/769,395, filed Jan. 1, 2001, pending.
U.S. patent application Ser. No. 09/983,249, filed Oct. 20, 2001, pending.
U.S. patent application Ser. No. 983,175, filed Oct. 23, 2001, pending.

(List continued on next page.)

Primary Examiner—Paul Ip
Assistant Examiner—Dung Nguyen
(74) Attorney, Agent, or Firm—Oblon, Spivak, McClelland, Maier & Neustadt, P.C.

(57) ABSTRACT

A distributed feedback semiconductor laser device including an active layer, a diffraction grating disposed in a vicinity of the active layer and having a substantially uniform space period and a distributed feedback function, and a functional layer disposed in a vicinity of the diffraction grating and the active layer and having a function of controlling a refractive index of the active layer, whereby the functional layer controls a lasing wavelength of the active layer. The functional layer of controlling the refractive index of the distributed feedback semiconductor laser device can generate a plurality of the lasing wavelengths different among one another and easily controllable.

7 Claims, 4 Drawing Sheets

OTHER PUBLICATIONS

U.S. patent application Ser. No. 09/930,130, filed Aug. 16, 2001, pending.
U.S. patent application Ser. No. 09/832,885, filed Apr. 12, 2001, pending.
U.S. patent application Ser. No. 09/769,395, filed Jan. 26, 2001, pending.
U.S. patent application Ser. No. 09/793,881, filed Feb. 28, 2001, pending.
U.S. patent application Ser. No. 09/828,144, filed Apr. 9, 2001, pending.
U.S. patent application Ser. No. 09,865,444, filed May 29, 2001, pending.
U.S. patent application Ser. No. 09,874,278, filed Jun. 6, 2001, pending.
U.S. patent application Ser. No. 09/769,395, filed Jan. 26, 2001, pending.
U.S. patent application Ser. No. 09/987,536, filed Nov. 15, 2001, pending.
U.S. patent application Ser. No. 10/015,656, filed Dec. 17, 2001, pending.

* cited by examiner

DISTRIBUTED FEEDBACK SEMICONDUCTOR LASER DEVICE AND MULTI-WAVELENGTH LASER ARRAY

BACKGROUND OF THE INVENTION (a) Field of the Invention

The present invention relates to a distributed feedback semiconductor laser device and a multi-wavelength laser array which can be utilized as a signal source for wavelength division multiplexing (WDM) telecommunication, more in detail to those easily and economically fabricated, and a method for fabricating the same.

(b) Description of the Related Art

A multi-wavelength laser device has been attracting public attention, which generates a plurality of laser rays having different wavelengths as a signal source for the WDM telecommunication for transmitting a plenty of information through a single optical fiber by using the wavelength division multiplex technique.

In a conventional distributed feedback semiconductor laser device (DFB-LD), (1) a process of changing a pitch (space period) of a diffraction grating and (2) a process of changing a thickness or a composition of an active layer have been proposed for changing or controlling the lasing wavelength based on the Bragg's reflection equation as follows:

$$p = (N/\lambda)/(2n_{eq}),$$

wherein "p" is a pitch of the diffraction grating, $\lambda$ is a transmission wavelength, "N" is an order of the diffraction, and $n_{eq}$ is an effective refractive index (or equivalent refractive index).

The process of changing the lasing wavelength by changing the pitch of the a diffraction grating utilizes a principle that only a ray having an wavelength satisfying the Bragg's reflection equation is transmitted with the increased strength in the diffraction grating. In the process, the diffraction grating having a pitch for increasing the strength of a ray with a desired wavelength and transmitting the ray is mounted in a resonator. For example, the change of the pitch of the diffraction grating by 0.01 nm varies the lasing wavelength by about 0.06 nm.

For fabricating the diffraction grating with the desired pitch, a layer of the diffraction grating is conventionally patterned by exposure with an electron beam lithography or by exposure using a master mask obtained by using the electron beam lithography.

In the other process, the lasing wavelength is varied by changing the thickness or the composition of the active layer to modify the equivalent refractive index while keeping the pitches of the diffraction grating constant. The composition of the active layer is changed by using a selective area growth method utilizing an MOCVD (metal organic chemical vapor deposition) process.

However, in the first process, it is extremely difficult that the requirement of the strict pitch control of the diffraction grating is satisfied during the fabrication of the diffraction grating having a frequency spacing with 100 GHz (about 0.8 nm with 1.5 $\mu$m wavelength range) level required for the high density WDM telecommunication system.

In order to conduct the strict pitch control, the expensive electron beam alignor is required, thereby dissatisfying the economical standard because the equipment cost is increased and the productivity is decreased.

Further, in the second process, the strict control of the thickness or the composition of the active layer by using the selective area growth method is difficult in reality, and the productivity thereof is low.

Accordingly, a new process in place of the conventional method of fabricating the distributed feedback semiconductor laser device has been demanded.

SUMMARY OF THE INVENTION

In view of the foregoing, an object of the present invention is to provide a distributed feedback semiconductor laser device which can generate different lasing wavelengths and a lasing structure easily fabricated, and a method for fabricating the same.

Thus, the present invention provides, in a first aspect thereof, a distributed feedback semiconductor laser device including an active layer, a diffraction grating disposed in a vicinity of the active layer and having a substantially uniform space period and a distributed feedback function, and a functional layer disposed in a vicinity of the diffraction grating and the active layer and having a function of controlling a refractive index of the active layer, whereby the functional layer controls a lasing wavelength of the active layer (hereinafter referred to as "first invention").

In accordance with the first invention, the layer having the function of controlling the equivalent refractive index can generate a plurality of the lasing wavelengths different among one another and easily controllable.

The present invention provides, in a second aspect thereof, a multi-wavelength laser array including a common substrate, and a plurality of ridge wave guide type semiconductor laser devices disposed in an array overlying the common substrate, wherein each of the semiconductor laser device includes the functional layer as defined in claim 1 (hereinafter referred to as "second invention").

In accordance with the second invention, the distributed feedback semiconductor laser device of claim 1 disposed in the array overlying the common substrate can generate the lasing wavelengths different among one another to provide the multi-wavelength laser array which is easily fabricated and economical.

The present invention further provides, in third and fourth aspects, methods for fabricating the distributed feedback semiconductor laser device of the first invention and the multi-wavelength laser array of the second invention.

The above and other objects, features and advantages of the present invention will be more apparent from the following description.

PREFERRED EMBODIMENTS OF THE INVENTION

Now, the present invention is more specifically described with reference to accompanying drawings.

Embodiment 1 of Multi-Wavelength Laser Array

Figure 1:
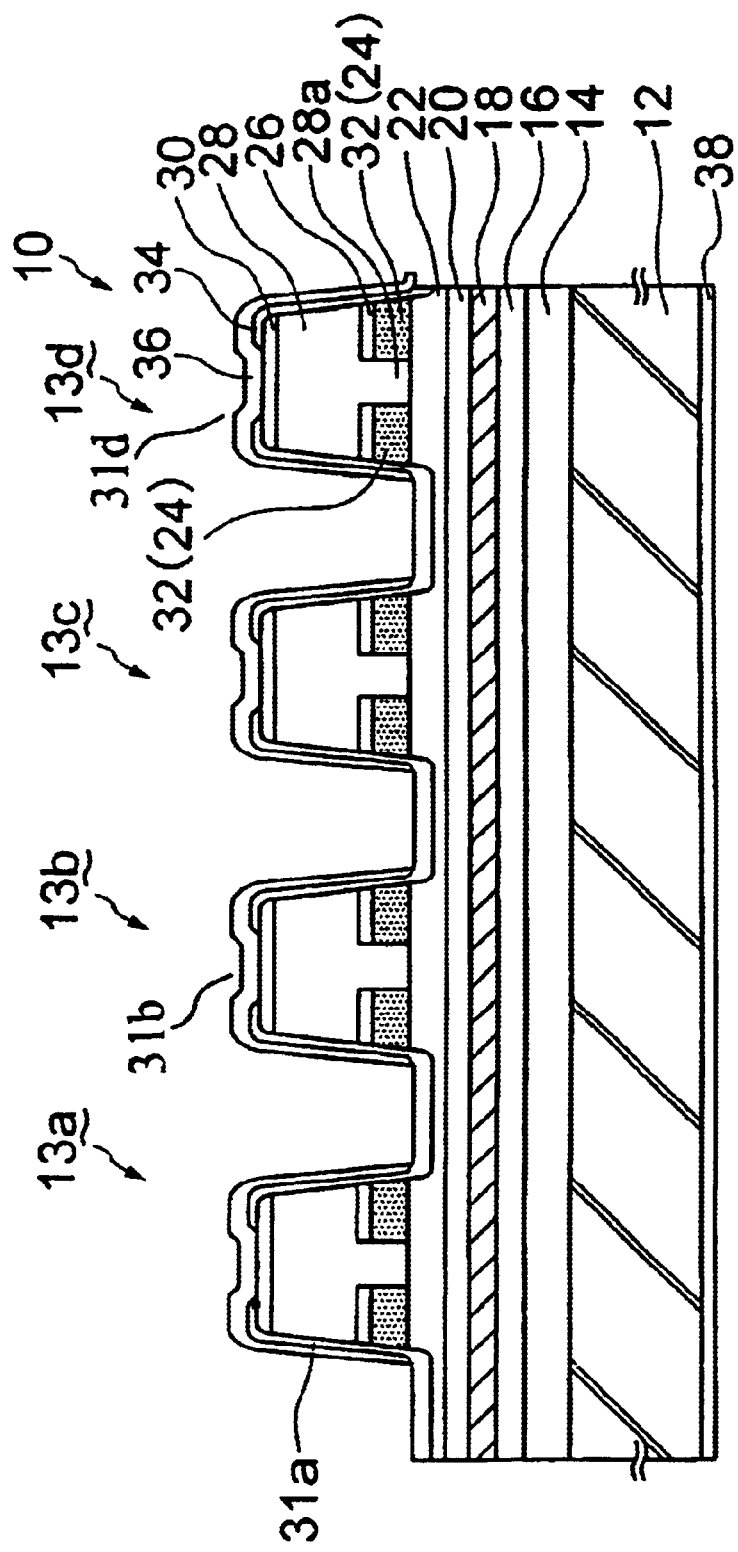
FIG. 1 is a sectional view showing the configuration of a multi-wavelength laser array of Embodiment 1.

As shown in FIG. 1, a multi-wavelength laser array 10 of the present embodiment includes a plurality of ridge path type semiconductor laser devices 13a to 13f (only the semiconductor laser devices 13a to 13d are shown in FIG. 1) having wavelengths different among one another and disposed in an array overlying an n-InP substrate 12. Each of the semiconductor laser devices 13a to 13d is an example of the distributed feedback semiconductor laser device of the first invention.

In each of the semiconductor laser devices 13a to 13d structures, an n-InP buffer layer 14, a non-doped GaInAsP layer 16 having a band gap wavelength of 1.1 μm, a non-doped strained quantum well active layer 18, a non-doped GaInAsP layer 20 including a diffraction grating with the same pitch having a band gap wavelength of 1.1 μm, a p-InP cladding layer 22 having a thickness of 100 nm, an Al oxide layer 32 obtained by selectively oxidizing Al in a p-AlInAs oxidizable layer 24 with a thickness of 100 nm and a p-GaInAsP layer 26 having a thickness of 30 nm are epitaxially grown and sequentially stacked on the InP substrate 12.

The active layer 18 is formed by a GaInAsP quantum well having a thickness of 5 nm and an amount of compressive strain of 1% and a GaInAsP barrier layer having a thickness of 10 nm and a band gap wave length of 1.1 μm. The number of the wells is six.

Each of the semiconductor laser devices 13a to 13d further includes a p-InP cladding layer 28 having a thickness of 2 μm and a p-GaInAs contact layer 30 having a thickness of 0.5 μm.

In the stacked structure, striped ridges 31a to 31f (only the striped ridges 31a to 31d are shown in FIG. 1) having a width of 5 μm are formed at the same interval on the top portions of the contact layer 30, the p-InP cladding layer 28, the p-GaInAsP layer 26, the p-AlInAs oxidizable layer 24 and the p-InP cladding layer 22.

Each of the ridges 31a to 31d further includes a p-InP cladding layer 28a having a channel shape with a thickness of 100 nm and a specified width at the respective central portion, and the Al oxide layer 32 obtained by selectively oxidizing Al in a p-AlInAs oxidizable layer 24 at the both sides thereof.

The p-InP cladding layer 28a is consecutively formed with the p-InP cladding layer 28 in the same step, and the channel widths of the striped ridges 31a, 31b, 31c, 31d and 31f are 2.0 μm, 2.3 μm, 2.6 μm, 2.9 μm, 3.2 μm and 3.5 μm, respectively.

SiN films 34 acting as a dielectric film and a protection film are formed on the cladding layer 22 and each of the ridges 31a to 31d, and p-electrodes 36 are formed on the SiN film 34 for each of the semiconductor laser devices 13a to 13d. A common n-electrode 38 is formed on the bottom surface of the common n-InP substrate 12. Each of the p-electrodes 36 is connected to each of the contact layers 30 through each of windows formed in the SiN films 34 on each of the ridges 31a to 31d.

The distribution of an electric field having a certain broadness generated by a voltage applied between the p-electrode 36 and the n-electrode 38 is uniformly transmitted in the p-InP cladding layer 28 and changed at the interface between the p-InP cladding layer 28 and the Al oxide layer 32.

Thereby, the equivalent refractive index of the active layer varies with the channel widths. Accordingly, the lasing wavelengths of each of the distributed feedback semiconductor laser devices 13a to 13d can be changed by controlling the channel widths.

Figure 2:
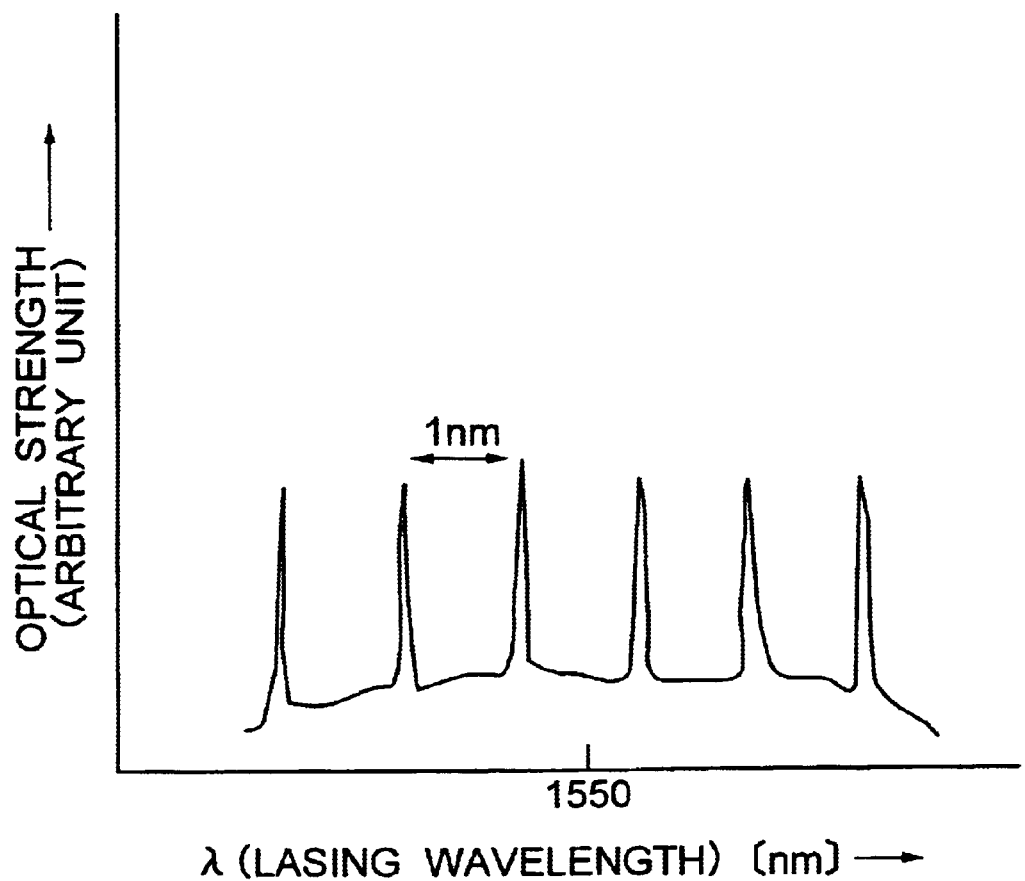
FIG. 2 is a graph showing a relation between a lasing wavelength and an optical strength.

As shown in FIG. 2, each of the distributed feedback semiconductor laser devices 13a to 13f can generate the lasing wavelengths having 1 nm intervals around 1550 nm in the multi-wavelength laser array 10 of the present embodiment.

Since the multi-wavelength laser array 10 is the ridge path type semiconductor laser devices, a high speed modulation is possible.

Embodiment 2 of Multi-Wavelength Laser Array

A multi-wavelength laser array of the present embodiment has substantially same configuration and effect as those of the multi-wavelength laser array of Embodiment 1 except that a p-AlInAs oxidizable layer 24 acting as the non-Al oxide layer is used in place of the p-InP cladding layer 28a of Embodiment 1.

Embodiment 1 of Fabrication of Multi-Wavelength Laser Array

Figure 3A:
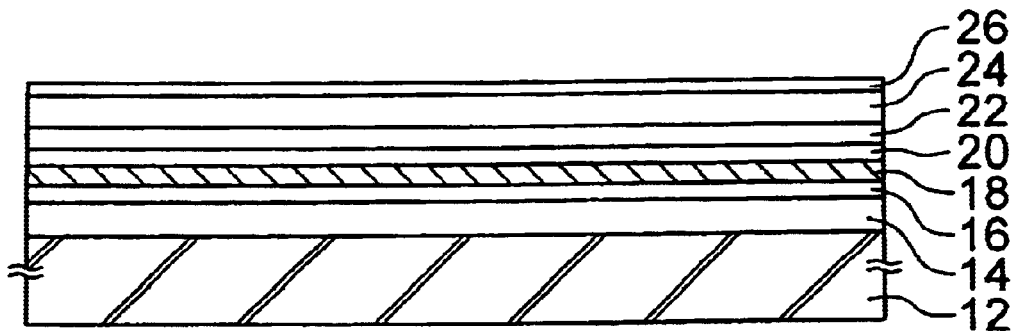
FIGS. 3A to 3E are sectional views sequentially showing a series of steps of fabricating the multi-wavelength laser array of Embodiment 1.

At first, as shown in FIG. 3A, an n-InP buffer layer 14, a non-doped GaInAsP layer 16 having a band gap wavelength of 1.1 μm are grown on n-InP substrate in a first growth step. After forming uniform grating with a pitch of approximately 240 nm, a non-doped distortion quantum well active layer 18, a non-doped GaInAsP layer 20 having a band gap wavelength of 1.1 μm, a p-InP cladding layer 22 having a thickness of 100 nm, a p-AlInAs oxidizable layer 24 having a thickness of 100 nm, and a p-GaInAsP layer 26 having a thickness of 30 nm are epitaxially grown and sequentially stacked on the InP substrate 12 in a second growth step by using the MOCVD method.

Figure 3B:
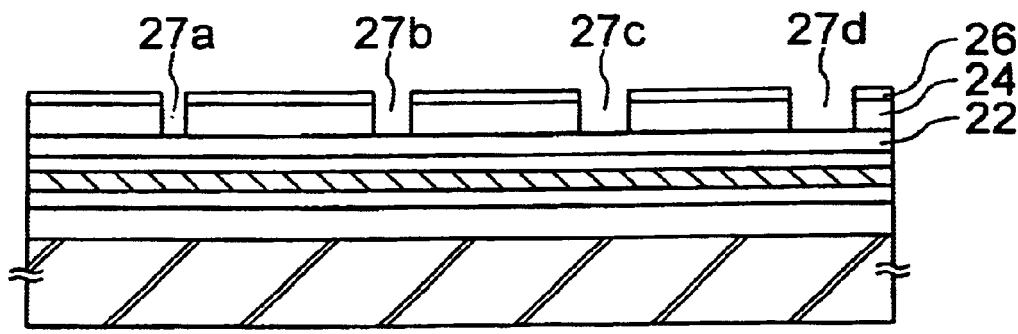

Then, as shown in FIG. 3B, the p-GaInAsP layer 26 and the AlInAs oxidizable layer 24 are etched by using the photolithography and chemical etching to pattern channels 27a to 27f (only the channels 27a to 27d are shown in FIG. 3B) having a specified width at a specified interval, thereby exposing the cladding layer 22 to the bottom of the channels 27. The widths of the channels 27a to 27f are 2.0 μm, 2.3 μm, 2.6 μm, 2.9 μm, 3.2 μm and 3.5 μm in this turn. The interval between the adjacent channels is the same as that between mesas described later.

Figure 3C:
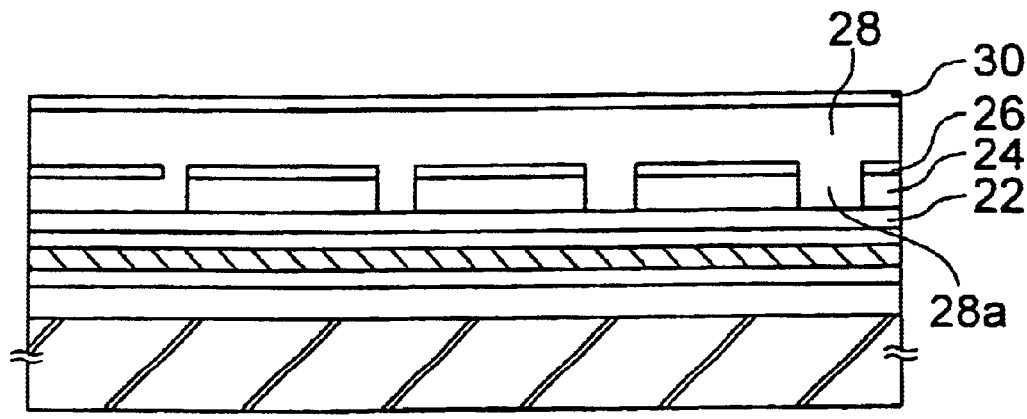

Then, as shown in FIG. 3C, in a third growth step, a p-InP cladding layer 28 having a thickness of 2 μm is formed by using the MOCVD process on the p-GaInAsP layer 26 and the p-AlInAs oxidizable layer 24 to fill the channels 27 for forming embedded layers 28a to 28d, and further a p-GaInAs contact layer 30 having a thickness of 0.5 μm is consecutively grown.

Figure 3D:
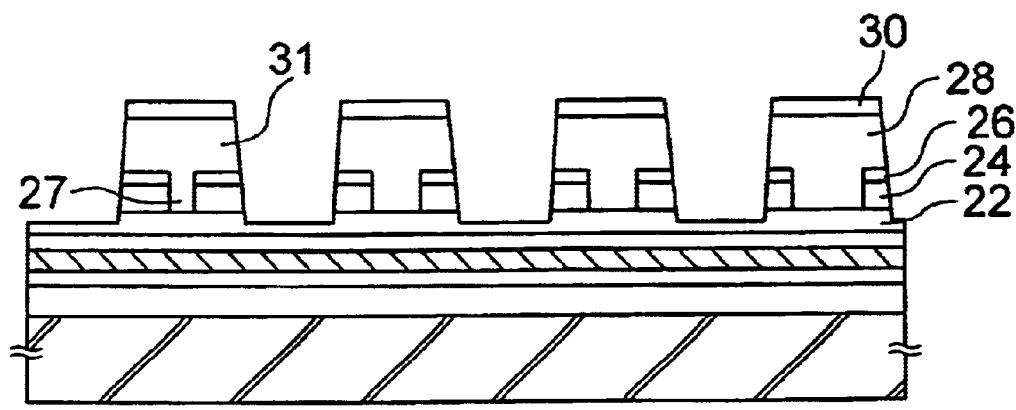

Then, as shown in FIG. 3D, striped mesas having a width of 5 μm are formed on each of the channels 27a to 27d at the centers of the channels by etching the top portions of the contact layer 30, the p-InP cladding layer 28, the p-GaInAsP layer 26, the p-AlInAs oxidizable layer 24 and the p-InP cladding layer 22.

Figure 3E:
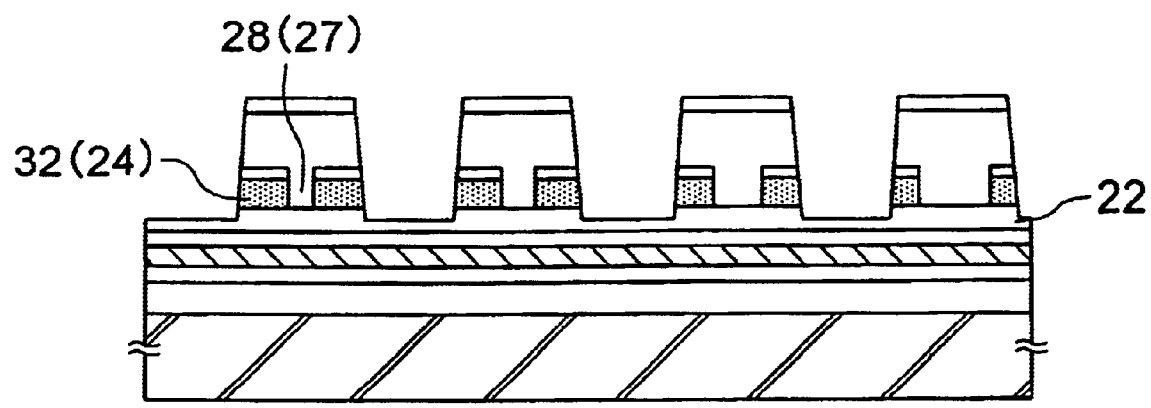

Then, the Al in the p-AlInAs oxidizable layer 24 is selectively oxidized under a steam atmosphere at 500° C. Thereby, as shown in FIG. 3E, the p-AlInAs oxidizable layer 24 on both sides of the cladding layer 28a formed by filling the channels 27 is oxidized to be converted into an Al oxide layer 32. It should be noted that oxidation of p-AlInAs stops automatically as shown in FIG. 3E.

SiN films 34 acting as a dielectric film and a passivation film are formed on the cladding layer 22 and each of the ridges 31a to 31d, and windows are opened in the SiN films 34 on each of the ridges 31a to 31d.

Further, p-electrodes 36 are formed on the SiN film 34 for each of the semiconductor laser devices 13a to 13d. A common n-electrode 38 is formed on the bottom surface of the common n-InP substrate 12. Each of the p-electrodes 36 is connected to each of the contact layers 30 through each of the windows formed in the SiN films 34 on each of the ridges 31a to 31d.

Thereby, the multi-wavelength laser array 10 of Embodiment 1 can be obtained.

The photolithography and the chemical etching of the present embodiment precisely can control the width of the channels 27 to strictly regulate the interval among a plurality of the lasing wavelengths.

Embodiment 1 of Fabrication of Multi-Wavelength Laser Array

A multi-layered structure shown in FIG. 3A is formed by the same procedures as those of the fabrication method of Embodiment 1 except that the p-AlInAs oxidizable layers 24 having the different thicknesses are formed on each of the semiconductor laser devices 13a to 13d by using the selective area growth method.

Without etching the p-AlInAs oxidizable layers 24 to form the channels 27, the p-InP cladding layer 28 and the p-GaInAs contact layer 30 are consecutively grown on the p-AlInAs oxidizable layer 24 in a second growth step by using the MOCVD method similarly shown in FIG. 3C.

Then, striped mesas having a width of 5 µm are formed on each of the semiconductor laser devices 13a to 13d by etching the top portions of the contact layer 30, the p-InP cladding layer 28, the p-GaInAsP layer 26, the p-AlInAs oxidizable layer 24 and the p-InP cladding layer 22.

Then, the Al in the p-AlInAs oxidizable layer 24 is selectively oxidized under a water vapor atmosphere at 500° C. Thereby, the p-AlInAs oxidizable layer 24 remains unoxidized at the center of the ridge, and the Al in the p-AlInAs oxidizable layer 24 from both sides of the unoxidized p-AlInAs oxidizable layer 24 to both sides of the ridge is selectively oxidized to be converted into the Al oxide layer.

In the present embodiment, the thickness of the grown AlInAs layer is varied for controlling the widths of the unoxidized p-AlInAs oxidizable layer 24 by utilizing the difference of the selected oxidation rate. The widths increase in an arithmetical progression manner, that is, 2.0 µm, 2.3 µm, 2.6 µm, 2.9 µm, 3.2 µm and 3.5 µm with the increase of 0.3 µm.

Although, in the present Embodiment, the oxidation of the p-AlInAs oxidizable layer 24 is controlled to stop the oxidation halfway for remaining the unoxidized portion thereof, the entire p-AlInAs oxidizable layer 24 may be oxidized. In this case, the equivalent refractive index in the vicinity of the active layer is modified by the thickness of the p-AlInAs oxidizable layer 24.

Since the above embodiments are described only for examples, the present invention is not limited to the above embodiments and various modifications or alterations can be easily made therefrom by those skilled in the art without departing from the scope of the present invention.

What is claimed is:

1. A ridge waveguide type distributed feedback semiconductor laser device, comprising:

an active layer,
   a diffraction grating disposed directly or indirectly on top of or below the active layer and having a substantially uniform space period and a distributed feedback function, and
   a refractive index control layer disposed directly or indirectly on top of both the diffraction grating and the active layer, said refractive index control layer configured to control a refractive index of an emission region of the active layer in a horizontal direction.

2. The distributed feedback semiconductor laser device as defined in claim 1, wherein the refractive index control layer includes a non-Al oxide layer and a pair of Al oxide layers consecutively extending from both sides of the non-Al oxide layer along the active layer, and
   the refractive index of the emission region of the active layer depends on widths of the non-Al oxide layer in an extending direction of the active layer.

3. The distributed feedback semiconductor laser device as defined in claim 2, wherein the non-Al oxide layer comprises:

an oxidizable layer containing Al.

4. A multi-wavelength laser array, comprising:

a common substrate, and
   a plurality of ridge waveguide type semiconductor laser devices disposed in an array overlying the common substrate, wherein each of the semiconductor laser devices includes
   an active layer,
   a diffraction grating disposed directly or indirectly on top of or below the active layer and having a substantially uniform space period and a distributed feedback function, and
   a refractive index control layer disposed directly or indirectly on top of both the diffraction grating and the active layer, said refractive index control layer configured to control a refractive index of an emission region of the active layer in a horizontal direction.

5. A ridge waveguide type distributed feedback semiconductor laser device, comprising:

an active layer,
   a diffraction grating disposed directly or indirectly on top of or below the active layer and having a substantially uniform space period and a distributed feedback function, and
   a refractive index control layer disposed directly or indirectly on top of both the diffraction grating and the active layer, said refractive index control layer configured to control a refractive index of an emission region of the active layer in a horizontal direction said refractive index control layer comprising a non-Al oxide layer and a pair of Al oxide layers consecutively extending from both sides of the non-Al oxide layer along the active layer, wherein
   the refractive index of the emission region of the active layer depends on widths of the non-Al oxide layer in an extending direction of the active layer.

6. The distributed feedback semiconductor laser device as defined in claim 5, wherein the non-Al oxide layer comprises:

an oxidizable layer containing Al.

7. A multi-wavelength laser stray, comprising:

a common substrate; and
   a plurality of ridge wave guide type semiconductor laser devices disposed in an array overlying the common substrate, wherein each of the semiconductor laser devices includes
   an active layer,
   a diffraction grating disposed directly or indirectly on top of or below the active layer and having a substantially uniform space period and a distributed feedback function, and
   a refractive index control layer disposed directly or indirectly on top of both the diffraction gating and the active layer, said refractive index control layer configured to control a refractive index of an emission region of the active layer in a horizontal direction, said refractive index control layer comprising a non-Al oxide layer and a pair of Al oxide layers consecutively extending from both sides of the non-Al oxide layer along the active layer, wherein the refractive index of the omission region of the active layer depends on widths of the non-Al oxide layer in an extending direction of the active layer.

* * * * *